(12) United States Patent
Masuda

(10) Patent No.: US 9,673,498 B2
(45) Date of Patent: Jun. 6, 2017

(54) HIGH FREQUENCY FILTER

(71) Applicant: Murata Manufacturing Co., Ltd., Nagaokakyo-shi, Kyoto-fu (JP)

(72) Inventor: Hiroshi Masuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 143 days.

(21) Appl. No.: 14/515,625

(22) Filed: Oct. 16, 2014

(65) Prior Publication Data

US 2015/0035624 A1    Feb. 5, 2015

Related U.S. Application Data

(63) Continuation of application No. PCT/JP2013/057759, filed on Mar. 19, 2013.

(30) Foreign Application Priority Data

May 1, 2012    (JP) ................. 2012-104621

(51) Int. Cl.
*H01P 1/203*    (2006.01)
*H03H 7/38*    (2006.01)
(Continued)

(52) U.S. Cl.
CPC .............. *H01P 1/203* (2013.01); *H01P 3/082* (2013.01); *H01P 5/10* (2013.01); *H03H 7/0123* (2013.01);
(Continued)

(58) Field of Classification Search
CPC ......... H03H 2001/0085; H03H 7/0115; H03H 7/42; H03H 7/422; H03H 7/383;
(Continued)

(56) References Cited

U.S. PATENT DOCUMENTS 5,406,235 A * 4/1995 Hayashi .................. H01P 1/203
                                                    333/202
2001/0054939 A1* 12/2001 Zhu ......................... H01P 3/088
                                                    333/33
(Continued)

FOREIGN PATENT DOCUMENTS

JP    2004-320556 A    11/2004
JP    2005-045447 A    2/2005
(Continued)

OTHER PUBLICATIONS

Official Communication issued in International Patent Application No. PCT/JP2013/057759, mailed on Jun. 25, 2013.

*Primary Examiner* — Stephen E Jones
*Assistant Examiner* — Rakesh Patel
(74) *Attorney, Agent, or Firm* — Keating & Bennett, LLP

(57) ABSTRACT

In a high frequency filter, a multilayer structure includes a plurality of insulator layers, a first transmission line transmits an input signal, and a second transmission line is electromagnetic coupled with the first transmission line on the same insulator layer and transmits an output signal. A conductor layer defines capacitors with the first transmission line and the second transmission line with the insulator layer in between. A dielectric constant of the insulator layer that comes in contact with the first transmission line and the second transmission line is higher than a dielectric constant of an insulator layer other than the insulator layer.

29 Claims, 6 Drawing Sheets

(51) Int. Cl.
   *H01P 3/08* (2006.01)
   *H01P 5/10* (2006.01)
   *H03H 7/42* (2006.01)
   *H03H 7/01* (2006.01)
   *H03H 7/09* (2006.01)
   *H03H 1/00* (2006.01)

(52) U.S. Cl.
   CPC .............. *H03H 7/42* (2013.01); *H03H 7/422* (2013.01); *H03H 7/09* (2013.01); *H03H 7/383* (2013.01); *H03H 2001/0085* (2013.01)

(58) Field of Classification Search
   CPC .......... H03H 7/0123; H03H 7/09; H01P 5/10; H01P 3/082; H01P 1/203
   USPC ....................... 333/25, 26, 33, 185, 204, 125
   See application file for complete search history.

(56) References Cited

U.S. PATENT DOCUMENTS

2007/0152780 A1* 7/2007 Liao .......................... H01P 5/10
                                                                333/204
2011/0140806 A1    6/2011 Taniguchi

FOREIGN PATENT DOCUMENTS

| JP | 2005-198241 A | 7/2005 |
| JP | 2007-214950 A | 8/2007 |
| JP | 2011-124880 A | 6/2011 |

* cited by examiner 10, 10-1~4

HIGH FREQUENCY FILTER

BACKGROUND OF THE INVENTION

Field of the Invention

The present invention relates to a high frequency filter including a plurality of insulator layers and transmission lines.

Description of the Related Art

As one of conventional high frequency filters, for example, a multilayer balanced filter described in Japanese Unexamined Patent Application Publication No. 2011-124880 is known. The multilayer balanced filter described in Japanese Unexamined Patent Application Publication No. 2011-124880 is described below. FIG. 10 is an exploded perspective view of a multilayer structure of the multilayer balanced filter 500 described in Japanese Unexamined Patent Application Publication No. 2011-124880. FIG. 11 is an equivalent circuit diagram of the multilayer balanced filter 500 described in Japanese Unexamined Patent Application Publication No. 2011-124880.

As illustrated in FIG. 10, the multilayer balanced filter 500 includes the multilayer structure 502, coils 531, 541 to 543, capacitor electrodes 521 to 523, and a ground electrode 520. The multilayer structure 502 is formed by stacking a plurality of dielectric layers 550 to 556.

The coils 531 and 541 are formed on the dielectric layer 553. The coil 542 is formed on the dielectric layer 552. The coil 543 is formed on the dielectric layer 551. The coil 531 electromagnetically couples to the coil 542 with the dielectric layer 552 in between by arranging the coil 531 and the coil 542 to oppose each other in a stacking direction of the multilayer structure 502. Further, one end portion of the coil 542 is connected to the coil 541 through a via-hole conductor. The other end portion of the coil 542 is connected to the coil 543 through a via-hole conductor.

The capacitor electrode 521 is formed on the dielectric layer 554. The capacitor electrodes 522 and 523 are formed on the dielectric layer 556. Further, the ground electrode 520 is formed on the dielectric layer 555.

A capacitor C100 is formed by arranging the ground electrode 520 and the capacitor electrode 521 so as to oppose each other across the dielectric layer 554. Further, the capacitor C100 is connected in parallel to the coil 531. As illustrated in FIG. 11, the capacitor C100 and the coil 531 form part of the multilayer balanced filter 500.

Further, a capacitor C200 is formed by arranging the ground electrode 520 and the capacitor electrode 522 so as to oppose each other across the dielectric layer 555. Further, the capacitor C200 is connected to the coil 541. As illustrated in FIG. 11, the capacitor C200 and the coil 541 form part of the multilayer balanced filter 500.

Further, a capacitor C300 is formed by arranging the ground electrode 520 and the capacitor electrode 523 so as to oppose each other across the dielectric layer 555. Further, the capacitor C300 is connected to the coil 543. As illustrated in FIG. 11, the capacitor C300 and the coil 543 form part of the multilayer balanced filter 500.

In the multilayer balanced filter 500 configured as described above, an unbalanced signal inputted from an input terminal 561 to the coil 531 is converted to a balanced signal in between the coil 531 and the coil 542, as illustrated in FIG. 11. The balanced signal is transmitted from the coil 542 to the coil 541 and the coil 543, and outputted from output terminals 562 and 563.

In the multilayer balanced filter 500, the coil 531 and the coil 542 are electromagnetically coupled by arranging them to oppose each other in the stacking direction with the dielectric layer 552 in between (broadside coupling). Accordingly, in the multilayer balanced filter 500, the area of insulator layers may be reduced compared to a multilayer balanced filter in which two coils are arranged on the same layer to produce electromagnetic coupling (edge coupling).

However, in the multilayer balanced filter 500, the coil 531 and the coil 542 face each other in the stacking direction. Thus, compared to the multilayer balanced filter in which two coils are arranged on the same layer to produce electromagnetic coupling, the multilayer balanced filter 500 stacks more insulator layers. In other words, it is difficult to reduce a profile height of the multilayer balanced filter 500.

SUMMARY OF THE INVENTION

Preferred embodiments of the present invention provide a high frequency filter that is configured to have a lower profile height while preventing an increase in a mounting area.

A high frequency filter according to a first preferred embodiment of the present invention includes a multilayer structure including a plurality of insulator layers stacked on each other; a first transmission line configured to transmit an input signal; a second transmission line configured to produce electromagnetic coupling with the first transmission line on a same insulator layer and transmit an output signal; and a conductor layer configured to define capacitors with the first transmission line and the second transmission line with the insulator layer in between, wherein a dielectric constant of a first insulator layer that comes in contact with the first transmission line and the second transmission line is higher than a dielectric constant of the insulator layer other than the first insulator layer.

High frequency filters according to various aspects of preferred embodiments of the present invention achieve a lower profile height while preventing an increase in a mounting area.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

High frequency filters according to preferred embodiments of the present invention are described below.

First Preferred Embodiment

Figure 1:
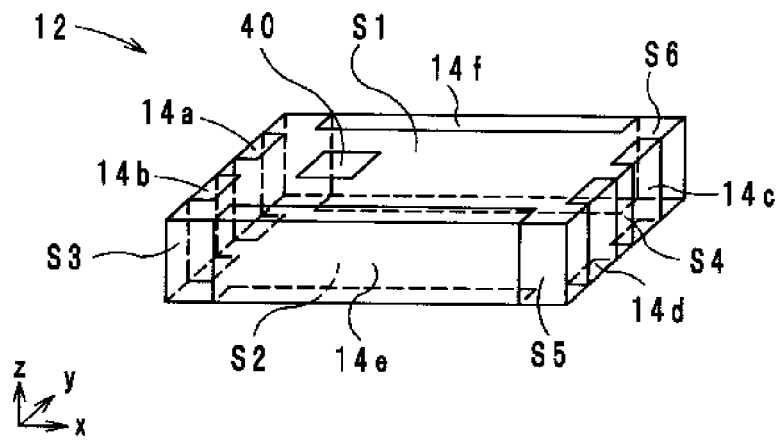
FIG. 1 is an external perspective view of a high frequency filter according to a first preferred embodiment of the present invention.
Figure 2:
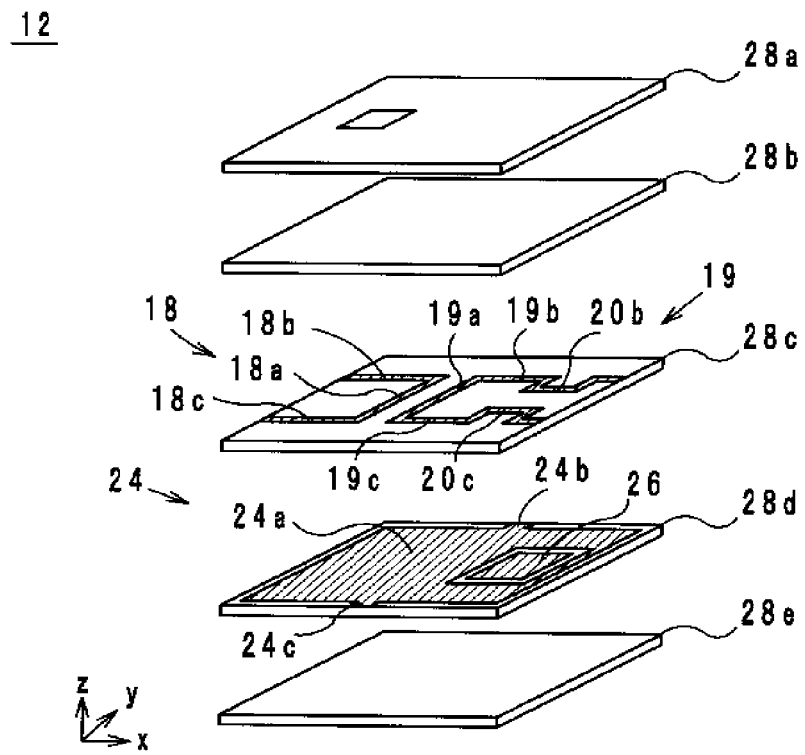
FIG. 2 is an exploded perspective view of a multilayer structure of the high frequency filter according to the first preferred embodiment of the present invention.
Figure 3:
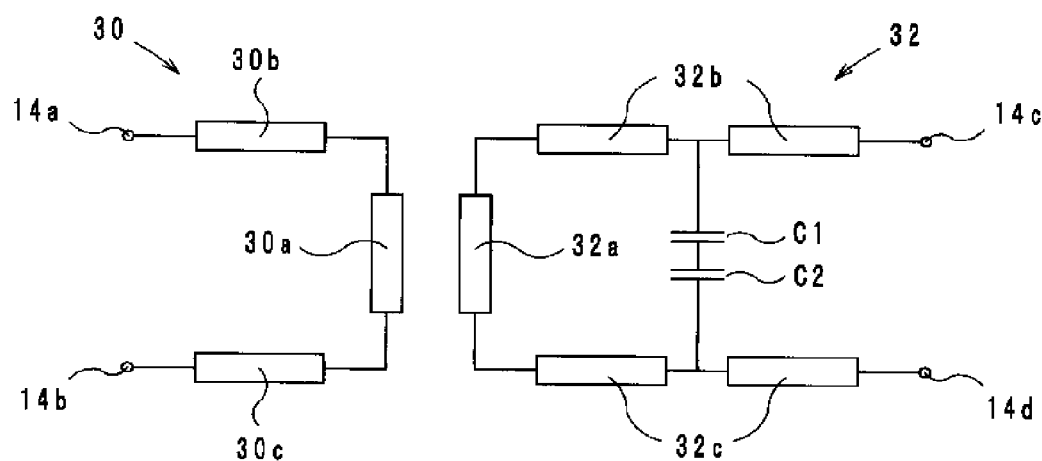
FIG. 3 is an equivalent circuit diagram of the high frequency filter according to the first preferred embodiment of the present invention.

A high frequency filter according to the first preferred embodiment of the present invention is now described below with reference to the drawings. FIG. 1 is an external perspective view of the high frequency filter according to the first preferred embodiment. FIG. 2 is an exploded perspective view of a multilayer structure of the high frequency filter according to the first preferred embodiment. FIG. 3 is an equivalent circuit diagram of the high frequency filter according to the first preferred embodiment. Hereinafter, it is defined that a stacking direction of a high frequency filter 10 is a z-axis direction. Further, it is defined that, in a planar view in the z-axis direction, a direction along a longer side of the high frequency filter 10 is an x-axis direction, and a direction along a shorter side of the high frequency filter 10 is a y-axis direction. The x-axis, the y-axis, and the z-axis are perpendicular or substantially perpendicular to each other.

The high frequency filter 10 includes a multilayer structure 12, outer electrodes 14a to 14f, transmission lines 18 and 19, a ground conductor 24, and a floating conductor 26, as illustrated in FIG. 1 and FIG. 2. The multilayer structure 12 includes insulator layers 28a to 28e, as illustrated in FIG. 2. Further, the multilayer structure 12 preferably has a cuboid shape as illustrated in FIG. 1, and includes an upper surface S1, a lower surface S2, and side surfaces S3 to S6. The upper surface S1 is a surface positioned at a positive direction side in the z-axis direction. The lower surface S2 is a surface positioned at a negative direction side in the z-axis direction. The side surface S3 is a surface positioned at a negative direction side in the x-axis direction. The side surface S4 is a surface positioned at a positive direction side in the x-axis direction. The side surface S5 is a surface positioned at a negative direction side in the y-axis direction. The side surface S6 is a surface positioned at a positive direction side in the y-axis direction.

The insulator layers 28a to 28e are stacked in this order from the positive direction side to the negative direction side in the z-axis direction, as illustrated in FIG. 2. Further, the insulator layers 28a to 28e each preferably have a rectangular or substantially rectangular shape with an identical or substantially identical size and shape in planar view along the z-axis direction, and fabricated from dielectric members such as ceramic or the like. Note that the dielectric constant of the insulator layer 28c is higher than those of the insulator layers 28a, 28b, 28d, and 28e (namely, insulator layers other than the insulator layer 28c). Hereinafter, surfaces of the insulator layers 28 at the positive direction side in the z-axis direction are referred to as top surfaces, and surfaces of the insulator layers 28 at the negative direction side in the z-axis direction are referred to as back surfaces. Note that a direction identity mark is provided on the top surface of the insulator layer 28a.

The transmission line 18 and the transmission line 19 are provided on the top surface of the insulator layer 28c, as illustrated in FIG. 2. Further, the transmission line 18 and the transmission line 19 are configured so as to line up in this order from the negative direction side to the positive direction side in the x-axis direction.

The transmission line 18 includes a coupling line portion 18a and extraction portions 18b and 18c, as illustrated in FIG. 2. The coupling line portion 18a extends in the y-axis direction near at an x-axis direction center of the top surface of the insulator layer 28c. The extraction portions 18b and 18c each extend in the x-axis direction. Here, the extraction portion 18b is the extraction portion positioned at the positive direction side in the y-axis direction, and the extraction portion 18c is the extraction portion positioned at the negative direction side in the y-axis direction.

An end portion of the extraction portion 18b at the positive direction side in the x-axis direction is connected to an end portion of the coupling line portion 18a at the positive direction side in the y-axis direction, as illustrated in FIG. 2. An end portion of the extraction portion 18b at the negative direction side in the x-axis direction is exposed from the side surface S3 of the multilayer structure 12. Further, an end portion of the extraction portion 18c at the positive direction side in the x-axis direction is connected to an end portion of the coupling line portion 18a at the negative direction side in the y-axis direction. An end portion of the extraction portion 18c at the negative direction side in the x-axis direction is exposed from the side surface S3 of the multilayer structure 12. In this way, when viewed in the z-axis direction, the transmission line 18 preferably has a letter U shape whose opening opens up to the negative direction side in the x-axis direction.

The transmission line 19 includes a coupling line portion 19a and extraction portions 19b and 19c, as illustrated in FIG. 2. The coupling line portion 19a extends in the y-axis direction near at an x-axis center of the top surface of the insulator layer 28c. The extraction portions 19b and 19c each extend in the x-axis direction. In other words, the transmission line 19 is provided with the extraction portions 19b and 19c (parallel portions), which are parallel or substantially parallel to each other. Here, the extraction portion 19b is the extraction portion positioned at the positive direction side in the y-axis direction, and the extraction portion 19c is the extraction portion positioned at the negative direction side in the y-axis direction.

An end portion of the extraction portion 19b at the negative direction side in the x-axis direction is connected to an end portion of the coupling line portion 19a at the positive direction side in the y-axis direction, as illustrated in FIG. 2. An end portion of the extraction portion 19b at the positive direction side in the x-axis direction is exposed from the side surface S4 of the multilayer structure 12. Further, an end portion of the extraction portion 19c at the negative direction side in the x-axis direction is connected to an end portion of the coupling line portion 19a at the negative direction side in the y-axis direction. An end portion of the extraction portion 19c at the positive direction side in the x-axis direction is exposed from the side surface S4 of the multilayer structure 12.

Further, the coupling line portion 18a is parallel or substantially parallel to the coupling line portion 19a, as illustrated in FIG. 2. Further, the coupling line portion 18a and the coupling line portion 19a face each other on the top surface of the insulator layer 28c. This allows the coupling line portion 18a and the coupling line portion 19a to generate electromagnetic coupling (edge coupling). Note that the lengths of the coupling line portion 18a and the coupling line portion 19a are determined from the wavelength of a high frequency signal that propagates through the transmission line 18 and the transmission line 19.

Here, the extraction portion 19b is provided with an adjuster portion 20b that occupies a portion of the extraction portion 19b. Further, the extraction portion 19c is provided with an adjuster portion 20c that occupies a portion of the extraction portion 19c. The adjuster portion 20b and the adjuster portion 20c face each other in the y-axis direction. As illustrated in FIG. 2, the y-axis direction distance between the adjuster portion 20b and the adjuster portion 20c is narrower than the y-axis direction distance between any portion other than the adjuster portion 20b in the extraction portion 19b and any portion other than the adjuster portion 20c in the extraction portion 19c.

The ground conductor 24 (conductor layer) faces the transmission line 18 and the transmission line 19 with the insulator layer 28c in between, as illustrated in FIG. 2. Further, the ground conductor 24 includes a main portion 24a and extraction portions 24b and 24c. The main portion 24a is configured so as to cover substantially the whole of the top surface of the insulator layer 28d except portions that oppose the adjuster portion 20b and the adjuster portion 20c.

The extraction portions 24b and 24c are provided on the top surface of the insulator layer 28d, as illustrated in FIG. 2. Further, the extraction portions 24b and 24c include wiring parallel or substantially parallel to the y-axis direction. Note that the extraction portion 24b is the extraction portion positioned at the positive direction side in the y-axis direction, and the extraction portion 24c is the extraction portion positioned at the negative direction side in the y-axis direction. An end portion of the extraction portion 24b at the negative direction side in the y-axis direction is connected to a center of a side of the main portion 24a at the positive direction side in the y-axis direction. Further, an end portion of the extraction portion 24b at the positive direction side in the y-axis direction is exposed from the side surface S6 of the multilayer structure 12. An end portion of the extraction portion 24c at the positive direction side in the y-axis direction is connected to a center of a side of the main portion 24a at the negative direction side in the y-axis direction. An end portion of the extraction portion 24c at the negative direction side in the y-axis direction is exposed from the side surface S5 of the multilayer structure 12.

The floating conductor 26 is provided on the top surface of the insulator layer 28d and faces the adjuster portion 20b and the adjuster portion 20c with the insulator layer 28c in between, as illustrated in FIG. 2. In other words, the floating conductor 26 is provided on the top surface of the insulator layer 28d in a state where the main portion 24a of the ground conductor 24 encircles the floating conductor 26. Note that the floating conductor 26 is not electrically continuous with the main portion 24a of the ground conductor 24. Further, the floating conductor 26 preferably has a rectangular or substantially rectangular shape when viewed in the z-axis direction.

The adjuster portions 20b and 20c, the floating conductor 26, and the insulator layer 28c define an impedance adjuster portion configured to adjust the impedance of the transmission line 19. Specifically, in the high frequency filter 10, the impedance adjuster portion preferably includes the following first structure and second structure. The first structure is a structure in which the floating conductor 26 faces portions of the transmission line 19 (namely, the adjuster portions 20b and 20c). The second structure is a structure in which the distance between the portions (adjuster portions 20b and 20c) of the extraction portions 19b and 19c differs from the distances between portions other than the adjuster portions 20b and 20c of the extraction portions 19b and 19c.

The transmission lines 18 and 19, the ground conductor 24, and the floating conductor 26 are formed preferably by a method such as sputtering, evaporation, printing, photolithography, or the like, and are composed of a material such as Ag—Pd, Ag, Pd, Cu, or the like.

The outer electrode 14a and the outer electrode 14b are provided on the side surface S3 of the multilayer structure 12, as illustrated in FIG. 1. Further, the outer electrode 14a and the outer electrode 14b are configured so as to line up in this order from the positive direction side to the negative direction side in the y-axis direction.

The outer electrode 14a is configured so as to extend in the z-axis direction on the side surface S3, as illustrated in FIG. 1. Further, the outer electrode 14a is folded back to the upper surface S1 and the lower surface S2. Further, the outer electrode 14a is connected to an end portion of the extraction portion 18b of the transmission line 18 at the negative direction side in the x-axis direction.

The outer electrode 14b is configured so as to extend in the z-axis direction on the side surface S3, as illustrated in FIG. 1. Further, the outer electrode 14b is folded back to the upper surface S1 and the lower surface S2. Further, the outer electrode 14b is connected to an end portion of the extraction portion 18c of the transmission line 18 at the negative direction side in the x-axis direction.

The outer electrode 14c and the outer electrode 14d are provided on the side surface S4 of the multilayer structure 12, as illustrated in FIG. 1. Further, the outer electrode 14c and the outer electrode 14d are configured so as to line up in this order from the positive direction side to the negative direction side in the y-axis direction.

The outer electrode 14c is configured so as to extend in the z-axis direction on the side surface S4, as illustrated in FIG. 1. Further, the outer electrode 14c is folded back to the upper surface S1 and the lower surface S2. Further, the outer electrode 14c is connected to an end portion of the extraction portion 19b of the transmission line 19 at the positive direction side in the x-axis direction.

The outer electrode 14d is configured so as to extend in the z-axis direction on the side surface S4, as illustrated in FIG. 1. Further, the outer electrode 14d is folded back to the upper surface S1 and the lower surface S2. Further, the outer electrode 14d is connected to an end portion of the extraction portion 19c of the transmission line 19 at the positive direction side in the x-axis direction.

The outer electrode 14e is configured so as to cover substantially the whole of the side surface S5, as illustrated in FIG. 1. Further, the outer electrode 14e is folded back to the upper surface S1 and the lower surface S2. Further, the outer electrode 14e is connected to an end portion of the extraction portion 24c of the ground conductor 24 at the negative direction side in the y-axis direction.

The outer electrode 14f is configured so as to cover substantially the whole of the side surface S6, as illustrated in FIG. 1. Further, the outer electrode 14f is folded back to the upper surface S1 and the lower surface S2. Further, the outer electrode 14f is connected to an end portion of the extraction portion 24b of the ground conductor 24 at the positive direction side in the y-axis direction.

The high frequency filter 10 having structures illustrated in FIG. 1 and FIG. 2 has a circuit configuration illustrated in FIG. 3. The transmission line 18 of the high frequency filter 10 corresponds to a resonator 30 illustrated in FIG. 3. Specifically, a capacitor is provided between the coupling line portion 18a of the transmission line 18 and the ground conductor 24 by arranging the coupling line portion 18a and the ground conductor 24 to oppose each other with the insulator layer 28c in between. Further, the coupling line portion 18a defines and functions as an inductor to high frequency signals. Accordingly, the coupling line portion 18a defines a stripline 30a. A capacitor is provided between the extraction portion 18b of the transmission line 18 and the ground conductor 24 by arranging the coupling line portion 18b and the ground conductor 24 to oppose each other with the insulator layer 28c in between. Further, the extraction portion 18b defines and functions as an inductor to high frequency signals. Accordingly, the extraction portion 18b defines a stripline 30b illustrated in FIG. 3. A capacitor is provided between the extraction portion 18c of the transmission line 18 and the ground conductor 24 by arranging the coupling line portion 18c and the ground conductor 24 to oppose each other with the insulator layer 28c in between. Further, the extraction portion 18c defines and functions as an inductor to high frequency signals. Accordingly, the extraction portion 18c defines a stripline 30c.

Further, the extraction portion 18b, the coupling line portion 18a, and the extraction portion 18c are connected in series in this order between the outer electrodes 14a and 14b. Accordingly, the striplines 30b, 30a, and 30c are connected in series in this order between the outer electrodes 14a and 14b.

The transmission line 19 of the high frequency filter corresponds to a resonator 32 illustrated in FIG. 3. Specifically, a capacitor is provided between the coupling line portion 19a of the transmission line 19 and the ground conductor by arranging the coupling line portion 19a and the ground conductor 24 to oppose each other with the insulator layer 28c in between. Further, the coupling line portion 19a defines and functions as an inductor to high frequency waves. Accordingly, the coupling line portion 19a defines a stripline 32a. A capacitor is formed between the extraction portion 19b of the transmission line 19 and the ground conductor 24 by arranging the coupling line portion 19b and the ground conductor 24 to oppose each other with the insulator layer 28c in between. Further, the extraction portion 19b defines and functions as an inductor to high frequency signals. Accordingly, the extraction portion 19b defines a stripline 32b illustrated in FIG. 3. A capacitor is provided between the extraction portion 19c of the transmission line 19 and the ground conductor 24 by arranging the coupling line portion 19c and the ground conductor 24 to oppose each other with the insulator layer 28c in between. Further, the extraction portion 19c defines and functions as an inductor to high frequency signals. Accordingly, the extraction portion 19c defines a stripline 32c.

Further, the extraction portion 19b, the coupling line portion 19a, and the extraction portion 19c are connected in series in this order between the outer electrodes 14c and 14d. Accordingly, the striplines 32b, 32a, and 32c are connected in series in this order between the outer electrodes 14c and 14d.

A capacitor C1 is provided between the adjuster portion 20b of the extraction portion 19b and the floating conductor 26 by arranging the adjuster portion 20b and the floating conductor 26 to oppose each other with the insulator layer 28c in between, as illustrated in FIG. 3. Further, a capacitor C2 is provided between the adjuster portion 20c of the extraction portion 19c and the floating conductor 26 by arranging the adjuster portion 20c and the floating conductor 26 to oppose each other with the insulator layer 28c in between. Accordingly, as illustrated in FIG. 3, the extraction portion 19b is connected to the extraction portion 19c via the capacitors C1 and C2 that are connected in series by having the adjuster portions 20b and 20c.

The high frequency filter 10 configured as described above may be used as a signal converter configured to perform reciprocal conversion between a balanced transmission line signal and an unbalanced transmission line signal.

The outer electrode 14a connected to the transmission line 18 is used as a signal input terminal. Further, the outer electrode 14b is connected to a ground electrode. Further, the outer electrodes 14c and 14d of the transmission line 19 are used as output terminals.

An unbalanced signal is inputted to the transmission line 18 from the outer electrode 14a. Subsequently, a balanced signal is generated at the transmission line 19 by having electromagnetic coupling between the transmission line 18 and the transmission line 19. The balanced signal is extracted from the outer electrodes 14c and 14d connected to the transmission line 19. Alternatively, a balanced signal may be inputted to the transmission line 19 from the outer electrodes 14c and 14d, and an unbalanced signal may be extracted from the outer electrode 14a connected to the transmission line 18.

Further, a high frequency signal inputted to the transmission line 18 passes through the striplines 30a to 30c. At this time, the striplines 30a to 30c define and function as a band filter and remove unwanted frequency components of the unbalanced signal inputted. Further, when extracting the balanced signal from the transmission line 19, the striplines 32a to 32c remove unwanted frequency components from the balanced signal.

Note that the degree of coupling formed between the transmission line 18 and the transmission line 19 may be varied by adjusting the distance between the transmission line 18 and the transmission line 19 or the distances to the ground conductor 24. This enables to adjust the pass band width of the high frequency filter 10.

The high frequency filter 10 configured as described above prevents an increase in the size of a mounting area. Specifically, the wavelength of a high frequency signal propagating over a transmission line on an insulator layer having a relatively-high dielectric constant is shorter than the wavelength of a high frequency signal propagating over a transmission line on an insulator layer having a relatively-low dielectric constant because of a wavelength shortening effect. Thus, in the high frequency filter 10, the dielectric constant of the insulator layer 28c on which the transmission lines 18 and 19 are provided is made larger than those of the insulator layers 28a, 28b, 28d, and 28e (namely, insulator layers other than the insulator layer 28c). In this way, the transmission lines 18 and 19 of the high frequency filter 10 is shorter than transmission lines of a high frequency filter where the transmission line 18 and the transmission line 19 are provided on the insulator layer having a relatively-low dielectric constant (insulator layer other than the insulator layer 28c). In other words, according to the high frequency filter 10, increases in the size of the mounting area are prevented.

Figure 10:
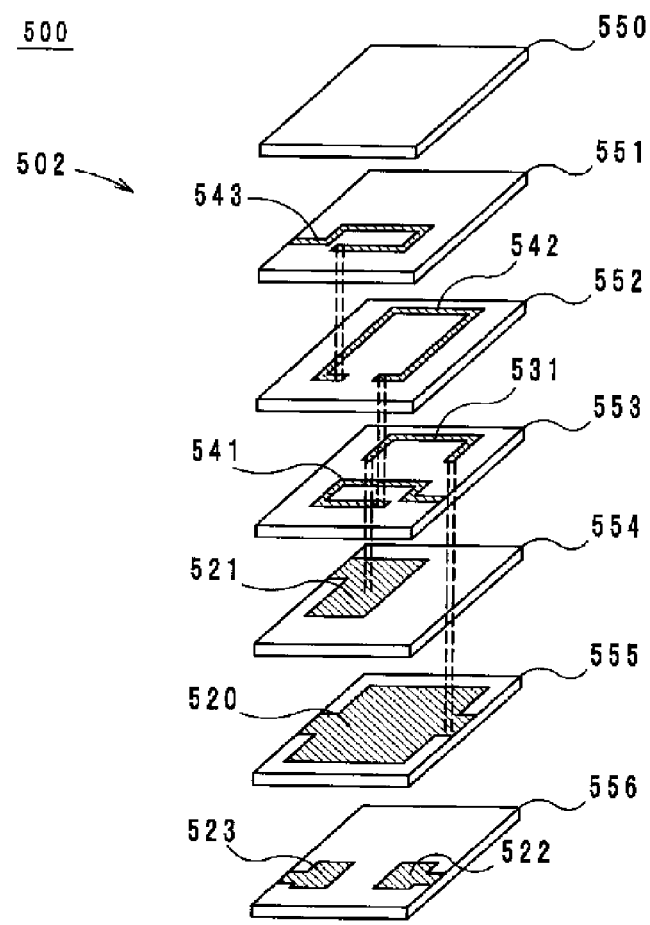
FIG. 10 is an exploded perspective view of a multilayer structure of a multilayer balanced filter described in Japanese Unexamined Patent Application Publication No. 2011-124880.
Figure 11:
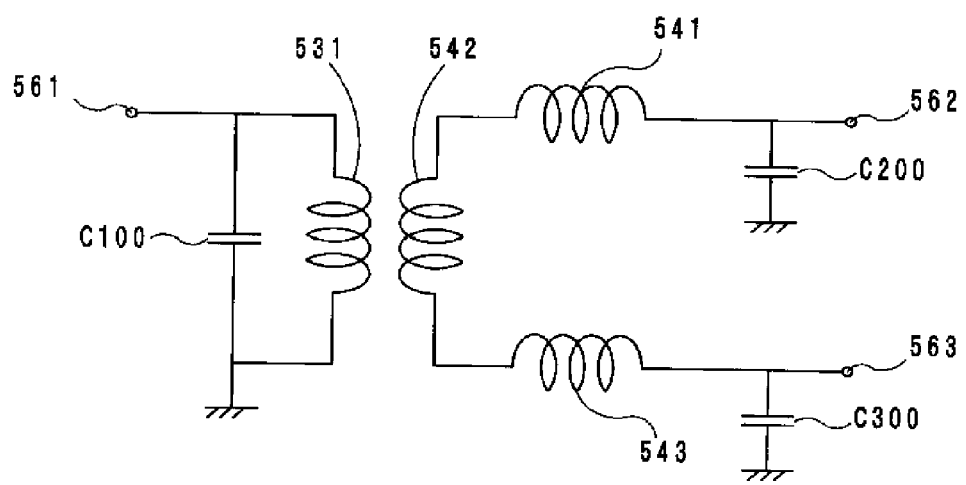
FIG. 11 is an equivalent circuit diagram of the multilayer balanced filter described in Japanese Unexamined Patent Application Publication No. 2011-124880.

Further, according to the high frequency filter 10, the profile of component is lowered. In the multilayer balanced filter 500, as illustrated in FIG. 10, the coil 531 and the coil 542 are arranged so as to oppose each other in the stacking direction to provide electromagnetic coupling (broadside coupling). On the other hand, as illustrated in FIG. 2, in the high frequency filter 10, the transmission line 18 and the transmission line 19 are arranged on the same insulator layer so as to oppose each other to provide electromagnetic coupling (edge coupling). Thus, the number of insulator layers required in the high frequency filter 10 is less than the number of insulator layers required in the multilayer balanced filter 500. In other words, according to the high frequency filter 10, a lower profile is achieved.

According to the high frequency filter 10, the profile of component is further lowered. Specifically, a certain size of area is required on a dielectric layer to obtain a certain capacity in order to have a matching circuit for impedance adjustment (hereinafter, a matching circuit indicates a matching circuit for impedance adjustment). Thus, in general, a matching circuit is provided on an insulator layer that is different from the insulator layer on which electromagnetically coupled transmission lines are provided to reduce the size of mounting area in a high frequency filter.

On the other hand, in the high frequency filter 10, a higher dielectric constant material is preferably used for the insulator layer 28c. This allows the matching circuit to achieve the certain capacity even with an area less than the certain size of area by providing the matching circuit on the insulator layer 28c. Thus, the area of the matching circuit of the high frequency filter 10, namely, the impedance adjuster portion (preferably defined by the adjuster portions 20b and 20c, the insulator layer 28c, and the floating conductor 26) is less than the area of a matching circuit of a typical high frequency filter. In this way, in the high frequency filter 10, the impedance adjuster portion preferably is provided on the top surface of the insulator layer 28c on which the transmission lines 18 and 19 are located, as illustrated in FIG. 2. Thus, in the high frequency filter 10, no additional insulator layer is required to provide a matching circuit, and the total number of insulator layers is reduced. In other words, according to the high frequency filter 10, the profile of component is further lowered.

Further, according to the high frequency filter 10, a stray capacitance produced between the ground conductor 24 and a board on which the high frequency filter 10 is mounted is significantly reduced or prevented. Specifically, in the high frequency filter 10, a higher dielectric constant material is preferably used only for the insulator layer 28c. If the same higher dielectric constant material used for the insulator layer 28c were used for the insulator layers 28d and 28e, a stray capacitance would be generated between the ground conductor 24 and the board on which the high frequency filter 10 is mounted. However, in the high frequency filter 10, a higher dielectric constant material is preferably used only in the insulator layer 28c. Thus, the generation of stray capacitance between the ground conductor 24 and the board is significantly reduced or prevented.

Further, according to the high frequency filter 10, the impedance adjustment is easily performed. Specifically, the y-axis direction distance between the adjuster portion 20b and the adjuster portion 20c is shorter than the y-axis direction distance between any portion other than the adjuster portion 20b in the extraction portion 19b and any portion other than the adjuster portion 20c in the extraction portion 19c. In this way, a minute capacitor C3 is provided between the adjuster portion 20b and the adjuster portion 20c. Further, the size of the capacitor C3 preferably is varied by adjusting the distance between the adjuster portion 20b and the adjuster portion 20c. Thus, according to the high frequency filter 10, the adjustment of impedance in a matching circuit is easily performed by adjusting the distance between the adjuster portion 20b and the adjuster portion 20c. Note that the capacitor C3 is not illustrated in the equivalent circuit diagram of FIG. 3, for the capacitor C3 is a minute capacitance.

According to the high frequency filter 10, the impedance adjustment is more easily performed. Specifically, the high frequency filter 10 is provided with the floating conductor 26 that is electrically discontinued with the ground conductor 24. Further, the capacitance generated between the floating conductor 26 and the transmission line 19 varies by adjusting an overlapping area of the floating conductor 26 and the transmission line 19 when viewed from the positive direction side in the z-axis direction. This makes it possible to perform the impedance adjustment easily in the high frequency filter 10.

First Modification Example

Figure 4:
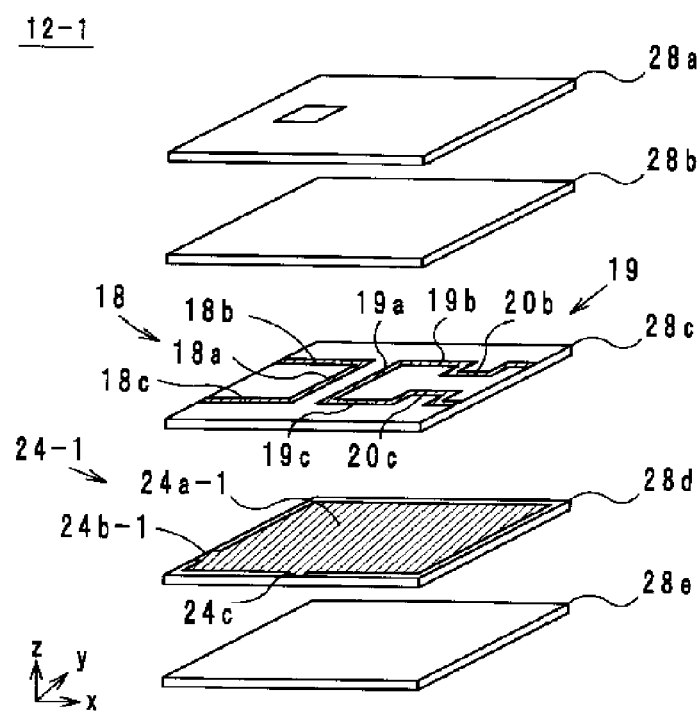
FIG. 4 is an exploded perspective view of a multilayer structure of a high frequency filter according to a first modification example of a preferred embodiment of the present invention.
Figure 5:
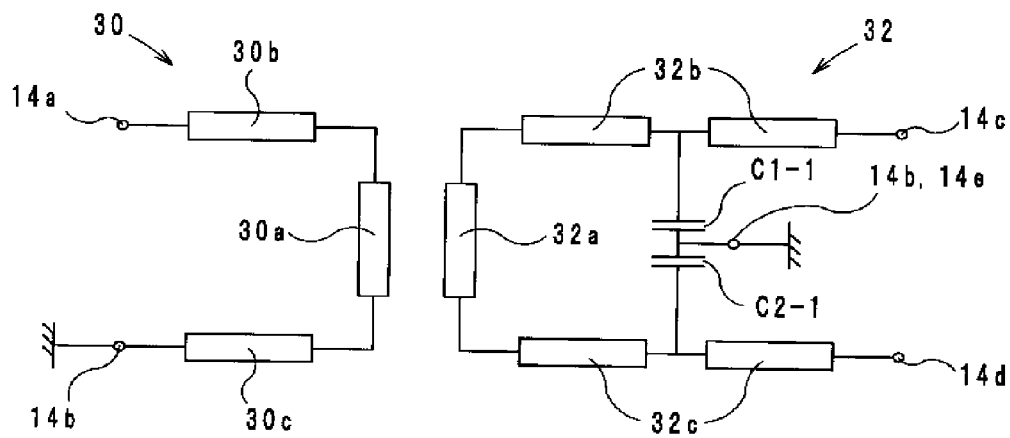
FIG. 5 is an equivalent circuit diagram of the high frequency filter according to the first modification example of a preferred embodiment of the present invention.

A high frequency filter 10-1 according to a first modification example of a preferred embodiment of the present invention is described below with reference to drawings. FIG. 4 is an exploded perspective view of a multilayer structure 12-1 of the high frequency filter 101 according to the first modification example. FIG. 5 is an equivalent circuit diagram of the high frequency filter 10-1 according to the first modification example illustrated in FIG. 4. As for the external perspective view, FIG. 1 is incorporated herein.

Differences between the high frequency filter 10 and the high frequency filter 10-1 lie in the shape of the ground conductor 24 and the presence or absence of the floating conductor 26. The remaining features are preferably identical or substantially identical in the high frequency filter 10 and the high frequency filter 10-1, and thus the descriptions thereof are omitted. Here, a ground conductor in the high frequency filter 10-1 is referred to as a ground conductor 24-1, and a main portion is referred to as a main portion 24a-1. Further, in FIG. 4 and FIG. 5, the same elements as in the high frequency filter 10 are designated by the same symbols as in the high frequency filter 10.

As illustrated in FIG. 4, no floating conductor 26 is provided at the top surface of the insulator layer 28d of the multilayer structure 12-1, and this top surface is covered with the ground conductor 24-1. Further, an extraction portion 24b-1 preferably includes wiring parallel or substantially parallel to the x-axis, as illustrated in FIG. 4. An end portion of the extraction portion 24b-1 at the positive direction side in the x-axis direction is connected to a side of the main portion 24a-1 at the negative direction side in the x-axis direction at near an end portion of the side at the negative direction side in the y-axis direction. Further, an end portion of the extraction portion 24b-1 at the negative direction side in the x-axis direction is exposed from the side surface S3 of the multilayer structure 12. In this way, the ground conductor 24-1 is connected to the transmission line 18 via the outer electrode 14b.

Further, in the high frequency filter 10-1, a capacitor C1-1 is provided between the adjuster portion 20b and the ground conductor 24-1 by arranging the adjuster portion 20b and the ground conductor 24-1 to oppose each other with the insulator layer 28c in between, as illustrated in FIG. 5. Further, a capacitor C2-1 is provided between the adjuster portion 20c and the ground conductor 24-1 by arranging the adjuster portion 20c and the ground conductor 24-1 to oppose each other with the insulator layer 28c in between. Accordingly, as illustrated in FIG. 5, the extraction portion 19b is connected to the extraction portion 19c via the capacitors C1-1 and C2-1 that are connected in series by including the adjuster portions 20b and 20c. Further, the capacitors C1-1 and C2-1 are grounded via the outer electrodes 14b and 14e.

In the high frequency filter 10-1 configured as described above, the adjuster portions 20b and 20c face the ground conductor 24-1. This allows center points of the capacitors C1-1 and C2-1 to be connected to ground. As a result, a balancing property may be stabilized when the high frequency filter 10 is used as an unbalanced-to-balanced signal converter.

Second Modification Example

Figure 6:
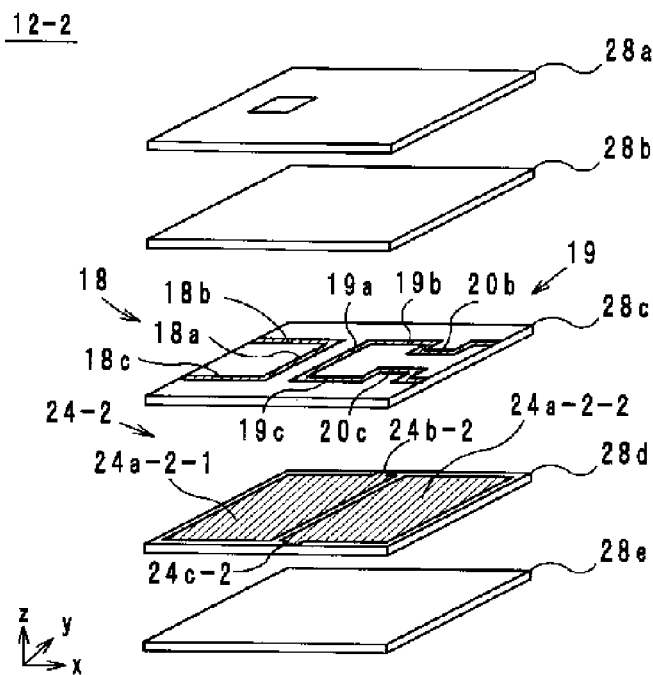
FIG. 6 is an exploded perspective view of a multilayer structure of a high frequency filter according to a second modification example of a preferred embodiment of the present invention.
Figure 7:
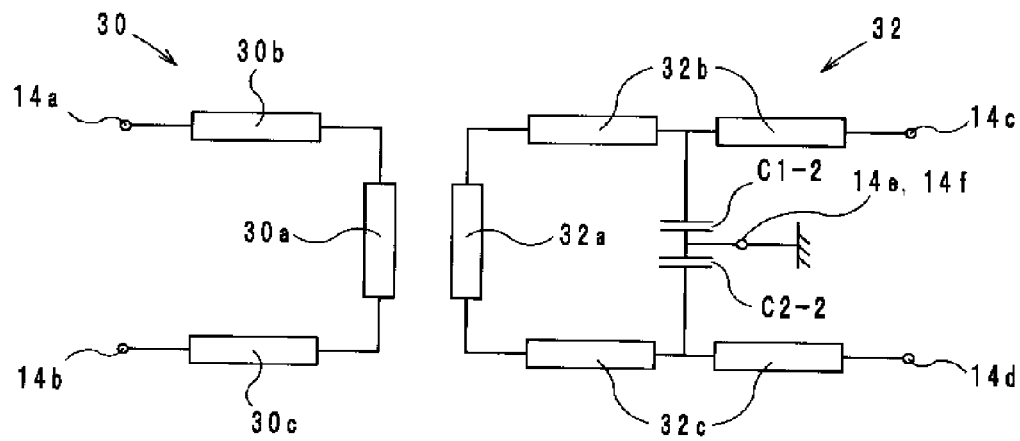
FIG. 7 is an equivalent circuit diagram of the high frequency filter according to the second preferred embodiment of the present invention.

A high frequency filter 10-2 according to a second modification example of a preferred embodiment of the present invention is described below with reference to drawings. FIG. 6 is an exploded perspective view of a multilayer structure 12-2 of the high frequency filter 10-2 according to the second modification example. FIG. 7 is an equivalent circuit diagram of the high frequency filter 10-2 according to the second modification example illustrated in FIG. 6. As for the external perspective view, FIG. 1 is incorporated herein.

Differences between the high frequency filter 10 and the high frequency filter 10-2 lie in the shape of the ground conductor 24 and the presence or absence of the floating conductor 26. The remaining features are preferably identical or substantially identical in the high frequency filter 10 and the high frequency filter 10-2, and thus the descriptions thereof are omitted. Here, a ground conductor in the high frequency filter 10-2 is referred to as a ground conductor 24-2, and a main portion is referred to as a main portion 24a-2. Further, in FIG. 6 and FIG. 7, the same elements as in the high frequency filter 10 are designated by the same symbols as in the high frequency filter 10.

As illustrated in FIG. 6, the main portion of the ground conductor 24-2 of the multilayer structure 12-2 is divided into two main portions 24a-2-1 and 24a-2-2. Here, the main portion 24a-2-1 is the main portion positioned at the negative direction side in the x-axis direction, and the main portion 24a-2-2 is the main portion positioned at the positive direction side in the x-axis direction. Further, no floating conductor 26 is provided at the top surface of the insulator layer 28d of the multilayer structure 12-2. Further, in the high frequency filter 10-2, a portion where the floating conductor 26 is located in the high frequency filter 10 is covered with the main portion 24a-2-2.

Extraction portions 24b-2 and 24c-2 of the ground conductor 24-2 preferably include wiring parallel or substantially parallel to the y-axis direction, as illustrated in FIG. 6. An end portion of the extraction portion 24b-2 at the negative direction side in the y-axis direction is connected to a side of the main portion 24a-2-1 at the positive direction side in the y-axis direction at near an end portion of the side at the positive direction side in the x-axis direction. Further, an end portion of the extraction portion 24b-2 at the positive direction side in the y-axis direction is exposed from the side surface S6 of the multilayer structure 12. This allows the main portion 24a-2-1 to be connected to the outer electrode 14f. An end portion of the extraction portion 24c-2 at the positive direction side in the y-axis direction is connected to a side of the main portion 24a-2-2 at the negative direction side in the y-axis direction at near an end portion of the side at the negative direction side in the x-axis direction. An end portion of the extraction portion 24c-2 at the negative direction side in the y-axis direction is exposed from the side surface S5 of the multilayer structure 12. This allows the main portion 24a-2-2 to be connected to the outer electrode 14e.

Further, in the high frequency filter 10-2, a capacitor C1-2 is provided between the adjuster portion 20b and the main portion 24a-2-2 of the ground conductor 24-2 by arranging the adjuster portion 20b and the main portion 24a-2-2 to oppose each other with the insulator layer 28c in between, as illustrated in FIG. 7. Further, a capacitor C2-2 is provided between the adjuster portion 20c and the main portion 24a-2-2 of the ground conductor 24-2 by arranging the adjuster portion 20c and the main portion 24a-2-2 to oppose each other with the insulator layer 28c in between. Accordingly, as illustrated in FIG. 7, the extraction portion 19b is connected to the extraction portion 19c via the capacitors C1-2 and C2-2 that are connected in series by including the adjuster portions 20b and 20c. Further, the capacitors C1-2 and C2-2 are grounded via the outer electrodes 14e and 14f.

The high frequency filter 10-2 configured as described above is provided with the two main portions 24a-2-1 and 24a-2-2. Further, the transmission line 18 faces the main portion 24a-2-1, and the transmission line 19 faces the main portion 24a-2-2. Thus, the main portion 24a-2-1 to which the transmission line 18 faces is not connected to the main portion 24a-2-2 to which the transmission line 19 faces. This weakens the electromagnetic coupling between the transmission line 18 and the transmission line 19. In other words, dividing the ground conductor 24-2 into two portions enables to weaken the electromagnetic coupling without changing the distance between the transmission line 18 and the transmission line 19. This enables to provide a wider margin to adjust the degree of coupling between the transmission lines.

Third Modification Example

Figure 8:
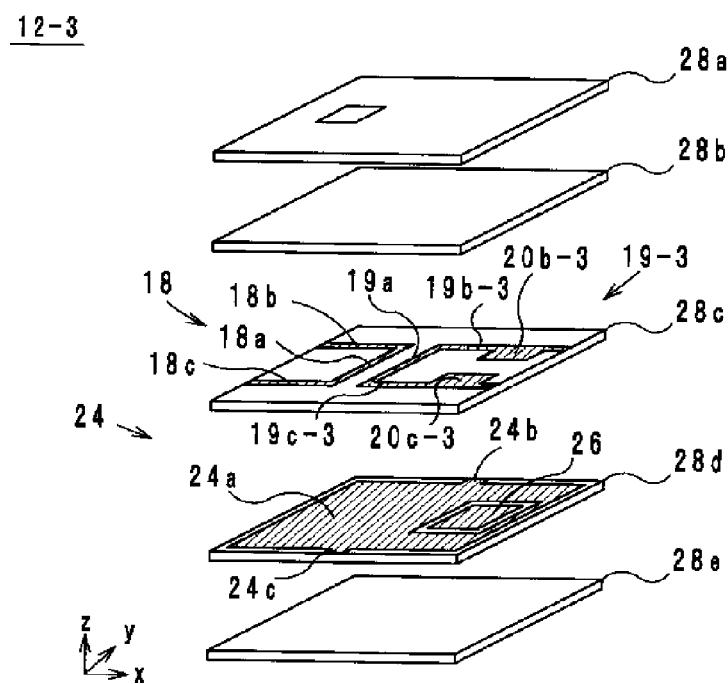
FIG. 8 is an exploded perspective view of a multilayer structure of a high frequency filter according to a third modification example of a preferred embodiment of the present invention.
Figure 9:
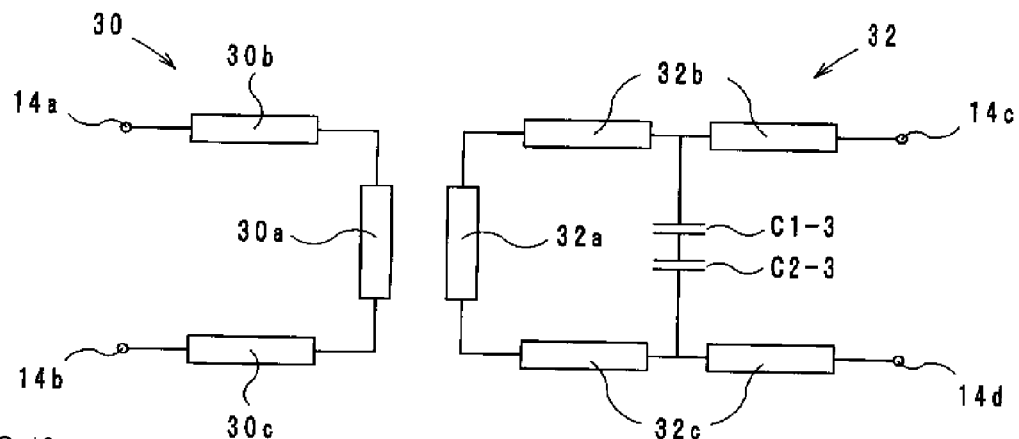
FIG. 9 is an equivalent circuit diagram of the high frequency filter according to the third preferred embodiment of the present invention.

A high frequency filter 10-3 according to a third modification example of a preferred embodiment of the present invention is described below with reference to drawings. FIG. 8 is an exploded perspective view of a multilayer structure 12-3 of the high frequency filter 10-3 according to the third modification example. FIG. 9 is an equivalent circuit diagram of the high frequency filter 10-3 according to the third modification example illustrated in FIG. 8. As for the external perspective view, FIG. 1 is incorporated herein.

A difference between the high frequency filter 10 and the high frequency filter 10-3 lies in the shapes of the adjuster portions 20b and 20c. The remaining features preferably are identical or substantially identical in the high frequency filter 10 and the high frequency filter 10-3, and thus the descriptions thereof are omitted. Note that a transmission line in the high frequency filter 10-3 is referred to as a transmission line 19-3, and that adjustment portions are referred to as adjuster portions 20b-3 and 20c-3. Further, in FIG. 8, the same elements as in the high frequency filter 10 are designated by the same symbols as in the high frequency filter 10.

As illustrated in FIG. 8, an extraction portion 19b-3 in the high frequency filter 10-3 is provided with an adjuster portion 20b-3 that occupies a portion of the extraction portion 19b-3. The line width of the adjuster portion 20b-3 is thicker than the line width of any portion other than the adjuster portion 20b-3 in the extraction portion 19b-3. Further, an extraction portion 19c-3 is provided with an adjuster portion 20c-3 that occupies a portion of the extraction portion 19c-3. The line width of the adjuster portion 20c-3 is thicker than the line width of any portion other than the adjuster portion 20c-3 in the extraction portion 19c-3. In this way, the impedance adjuster portion is configured such that the thicknesses of portions (adjuster portions 20b-3 and 20c-3) of the extraction portions 19b-3 and 19c-3 differ from the thicknesses of portions other than the portions (adjuster portions 20b-3 and 20c-3) of the extraction portions 19b-3 and 19c-3.

In the high frequency filter 10-3 configured as described above, capacitors C1-3 and C2-3 (see FIG. 9) provided between the adjuster portions 20b-3 and 20c-3 and the floating conductor 26 that faces thereto may be adjusted by varying the line widths of the adjuster portions 20b-3 and 20c-3. Further, in the high frequency filter 10-3, a minute capacitor C3-3 located between the adjuster portion 20b-3 and the adjuster portion 20c-3 may also be adjusted by varying the line widths of the adjuster portions 20b-3 and 20c-3.

Fourth Modification Example

A high frequency filter 10-4 according to a fourth modification example of a preferred embodiment of the present invention is described below. A difference between the high frequency filter 10 and the high frequency filter 10-4 lies in the dielectric constant of a portion of the insulator layer 28c. Note that, in the high frequency filter 10-4, an insulator layer corresponding to the insulator layer 28c in the high frequency filter 10 is referred to as an insulator layer 28c-4. The remaining features preferably are identical or substantially identical in the high frequency filter 10 and the high frequency filter 10-4, and thus the descriptions thereof are omitted. Further, as for the drawings of the high frequency filter 10-4 according to the fourth modification example, FIG. 1, FIG. 2, and FIG. 3 are incorporated herein.

The dielectric constant of the insulator layer 28c-4 of the high frequency filter 10-4 according to the fourth modification example is higher than those of the insulator layers 28a, 28b, 28d, and 28e (namely, insulator layers other than the insulator layer 28c-4). Further, in the insulator layer 28c-4, the dielectric constant of a portion located between the adjuster portions 20b and 20c and the floating conductor 26 is higher than the dielectric constants of other portions of the insulator layer 28c-4. In this way, the impedance adjuster portion is configured in such a way that, in the insulator layer 28c-4, the dielectric constant of a contact portion that comes in contact with portions (adjuster portions 20b, 20c) of the transmission line 19 is higher than the dielectric constants of portions other than the contact portion.

In the high frequency filter 10-4 configured as described above, the capacitors C1 and C2 provided between the adjuster portions 20b and 20c and the floating conductor 26 may be adjusted by varying the dielectric constant of the portion of the insulator layer 28c-4. Further, in the high frequency filter 10-4, the minute capacitor C3 provided between the adjuster portion 20b and the adjuster portion 20c may be adjusted by varying the dielectric constant of the portion of the insulator layer 28c. Thus, according to the high frequency filter 10-4, the adjustment of impedance in the matching circuit may be easily performed by adjusting the dielectric constant of the portion of the insulator layer 28c.

Other Preferred Embodiments

The high frequency filter according to the present invention is not limited to the high frequency filters 10, 10-1, 10-2, 10-3, or 10-4 according to the foregoing preferred embodiments or foregoing modification examples, and may be modified within the spirit and scope of the present invention.

Further, the elements of the high frequency filters 10, 10-1, 10-2, 10-3, and 10-4 may be combined, for example.

Note that, in the high frequency filter 10, the distance between the adjuster portions 20b and 20c may be made wider than the distances between portions other than the adjuster portions 20b and 20c of the extraction portions 19b and 19c, for example.

As described above, various preferred embodiments of the present invention and modifications and combinations thereof are useful for high frequency filters, and in particular, superior in achieving lower component profiles while preventing increases in a size of a mounting area.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency filter comprising:
a multilayer structure including a plurality of insulator layers;
a first transmission line configured to transmit an input signal;
a second transmission line provided on a same first insulator layer of the plurality of insulator layers that the first transmission line is provided on and configured to be electromagnetically coupled with the first transmission line and transmit an output signal; and
a conductor layer configured to define capacitors with the first transmission line and the second transmission line with the first insulator layer in between; wherein
a dielectric constant of the first insulator layer that comes in contact with the first transmission line and the second transmission line is higher than a dielectric constant of an insulator layer of the plurality of insulator layers other than the first insulator layer;
the second transmission line is provided with an impedance adjuster portion; and
the impedance adjuster portion is configured so that, in the first insulator layer, a dielectric constant of a contact portion that comes in contact with a portion of the second transmission line is higher than a dielectric constant of a portion other than the contact portion.

2. An electronic apparatus comprising:
a balanced transmission line;
an unbalanced transmission line; and
a signal converter configured to perform reciprocal conversion between the balanced transmission line and the unbalanced transmission line; wherein
the signal converter is defined by the high frequency filter according to claim 1.

3. The high frequency filter according to claim 1, wherein the first insulator layer is in contact with the conductor layer.

4. The high frequency filter according to claim 1, wherein the conductor layer is a ground conductor.

5. The high frequency filter according to claim 1, further comprising:
a floating conductor; wherein
the conductor layer is a ground conductor;

the floating conductor is not electrically continuous with the ground conductor; and the impedance adjuster portion is defined by the floating conductor being opposed to the portion of the second transmission line.

6. The high frequency filter according to claim 5, wherein the second transmission line includes two parallel portions that are parallel or substantially parallel to each other; and the impedance adjuster portion is configured so that a distance between portions of the two parallel portions differs from a distance between portions of the second transmission line other than the portions of the two parallel portions.

7. The high frequency filter according to claim 1, wherein the second transmission line includes a coupling line portion and extraction portions.

8. The high frequency filter according to claim 1, wherein the second transmission line includes two parallel portions that are parallel or substantially parallel to each other; and the impedance adjuster portion is configured so that a distance between portions of the two parallel portions differs from a distance between portions of the second transmission line other than the portions of the two parallel portions.

9. The high frequency filter according to claim 1, wherein the second transmission line includes two parallel portions that are parallel or substantially parallel to each other; and the impedance adjuster portion is configured so that thicknesses of portions of the two parallel portions differ from thicknesses of portions of the second transmission line other than the two parallel portions.

10. The high frequency filter according to claim 1, wherein the conductor layer is divided into plural portions.

11. The high frequency filter according to claim 1, wherein the input signal is an unbalanced signal; and
the output signal is a balanced signal.

12. The high frequency filter according to claim 1, wherein the first transmission line includes a coupling line portion and extraction portions.

13. The high frequency filter according to claim 1, wherein the first transmission line includes a coupling line portion and extraction portions, and the second transmission line includes a coupling line portion and extraction portions, and the coupling line portion of the first transmission line and the coupling line portion of the second transmission line are configured and arranged to generate the electromagnetic coupling.

14. The high frequency filter according to claim 13, wherein the impedance adjuster portion includes adjuster portions arranged to face each other, the extraction portions of the second transmission line are provided with the adjuster portions.

15. The high frequency filter according to claim 14, further comprising a floating conductor arranged to face the adjuster portions.

16. The high frequency filter according to claim 15, wherein the floating conductor, the adjuster portions, and the first insulator layer define the impedance adjuster portion.

17. A high frequency filter comprising:
a multilayer structure including a plurality of insulator layers;

a first transmission line configured to transmit an input signal;

a second transmission line provided on a same first insulator layer of the plurality of insulating layers that the first transmission line is provided on and configured to be electromagnetically coupled with the first transmission line and transmit an output signal;

a conductor layer configured to define capacitors with the first transmission line and the second transmission line with the first insulator layer in between; and a floating conductor; wherein
the conductor layer is a ground conductor;
the floating conductor is not electrically continuous with the ground conductor;

a dielectric constant of the first insulator layer that comes in contact with the first transmission line and the second transmission line is higher than a dielectric constant of an insulator layer of the plurality of insulator layers other than the first insulator layer;

the second transmission line is provided with an impedance adjuster portion; and the impedance adjuster portion is defined by the floating conductor being opposed to a portion of the second transmission line.

18. The high frequency filter according to claim 17, wherein the first transmission line includes a coupling line portion and extraction portions, and the second transmission line includes a coupling line portion and extraction portions, and the coupling line portion of the first transmission line and the coupling line portion of the second transmission line are configured and arranged to generate the electromagnetic coupling.

19. The high frequency filter according to claim 18, wherein the impedance adjuster portion includes adjuster portions arranged to face each other, the extraction portions of the second transmission line are provided with the adjuster portions.

20. The high frequency filter according to claim 19, wherein the floating conductor is arranged to face the adjuster portions.

21. The high frequency filter according to claim 20, wherein the floating conductor, the adjuster portions, and the first insulator layer define the impedance adjuster portion.

22. An electronic apparatus comprising:
a balanced transmission line;
an unbalanced transmission line; and
a signal converter configured to perform reciprocal conversion between the balanced transmission line and the unbalanced transmission line; wherein
the signal converter is defined by the high frequency filter according to claim 17.

23. The high frequency filter according to claim 17, wherein the first insulator layer is in contact with the conductor layer.

24. The high frequency filter according to claim 17, wherein the second transmission line includes two parallel portions that are parallel or substantially parallel to each other; and the impedance adjuster portion is configured so that a distance between portions of the two parallel portions differs from a distance between portions of the second transmission line other than the portions of the two parallel portions.

25. The high frequency filter according to claim 17, wherein the second transmission line includes two parallel portions that are parallel or substantially parallel to each other; and the impedance adjuster portion is configured so that thicknesses of portions of the two parallel portions differ from thicknesses of portions of the second transmission line other than the two parallel portions.

26. The high frequency filter according to claim 17, wherein the conductor layer is divided into plural portions.

27. The high frequency filter according to claim 17, wherein the input signal is an unbalanced signal; and the output signal is a balanced signal.

28. The high frequency filter according to claim 17, wherein the first transmission line includes a coupling line portion and extraction portions.

29. The high frequency filter according to claim 17, wherein the second transmission line includes a coupling line portion and extraction portions.

* * * * *